United States Patent
Chen et al.

(10) Patent No.: US 9,865,510 B2
(45) Date of Patent: Jan. 9, 2018

(54) DEVICE AND METHODS FOR HIGH-K AND METAL GATE SLACKS

(71) Applicant: Taiwan Semiconductor Manufacturing Company, Ltd., Hsin-Chu (TW)

(72) Inventors: Po-Nien Chen, Miaoli County (TW); Bao-Ru Young, Hsinchu County (TW); Harry-Hak-Lay Chuang, Singapore (SG); Jin-Aun Ng, Hsinchu (TW); Ming Zhu, Singapore (SG)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 0 days.

(21) Appl. No.: 14/975,055

(22) Filed: Dec. 18, 2015

(65) Prior Publication Data
US 2016/0190018 A1    Jun. 30, 2016

Related U.S. Application Data

(60) Division of application No. 14/250,448, filed on Apr. 11, 2014, now Pat. No. 9,219,125, which is a continuation of application No. 13/456,939, filed on Apr. 26, 2012, now Pat. No. 8,698,252.

(51) Int. Cl.
| | |
|---|---|
| *H01L 21/8238* | (2006.01) |
| *H01L 29/78* | (2006.01) |
| *H01L 27/06* | (2006.01) |
| *H01L 29/51* | (2006.01) |
| *H01L 21/28* | (2006.01) |
| *H01L 49/02* | (2006.01) |
| *H01L 29/06* | (2006.01) |
| *H01L 29/49* | (2006.01) |

(52) U.S. Cl.
CPC ........ *H01L 21/823842* (2013.01); *H01L 21/28158* (2013.01); *H01L 21/823857* (2013.01); *H01L 27/0629* (2013.01); *H01L 28/20* (2013.01); *H01L 29/0653* (2013.01); *H01L 29/4933* (2013.01); *H01L 29/511* (2013.01); *H01L 29/512* (2013.01); *H01L 29/517* (2013.01); *H01L 29/78* (2013.01)

(58) Field of Classification Search
CPC .................................... H01L 21/823871
USPC ........................................... 438/210
See application file for complete search history.

(56) References Cited

U.S. PATENT DOCUMENTS

| | | | |
|---|---|---|---|
| 7,678,636 B2 * | 3/2010 | Chuang | H01L 21/823807 438/210 |
| 8,008,143 B2 * | 8/2011 | Hsu | H01L 21/82345 438/275 |
| 8,698,252 B2 | 4/2014 | Chen et al. | |
| 9,000,533 B2 | 4/2015 | Wu et al. | |
| 2006/0043497 A1 | 3/2006 | Kimizuka et al. | |

(Continued)

*Primary Examiner* — Chandra Chaudhari
(74) *Attorney, Agent, or Firm* — Haynes and Boone, LLP

(57) ABSTRACT

A semiconductor device having five gate stacks on different regions of a substrate and methods of making the same are described. The device includes a semiconductor substrate and isolation features to separate the different regions on the substrate. The different regions include a p-type field-effect transistor (pFET) core region, an input/output pFET (pFET IO) region, an n-type field-effect transistor (nFET) core region, an input/output nFET (nFET IO) region, and a high-resistor region.

20 Claims, 15 Drawing Sheets

(56) References Cited

U.S. PATENT DOCUMENTS

| | | |
|---|---|---|
| 2010/0038721 A1 | 2/2010 | Lin et al. |
| 2010/0148262 A1 | 6/2010 | Stahrenberg et al. |
| 2010/0178772 A1 | 7/2010 | Lin et al. |
| 2011/0073964 A1 | 3/2011 | Chowdhury et al. |
| 2013/0285150 A1 | 10/2013 | Chen et al. |
| 2013/0299913 A1 | 11/2013 | Lin et al. |
| 2014/0203373 A1 | 7/2014 | Chen et al. |

* cited by examiner

DEVICE AND METHODS FOR HIGH-K AND METAL GATE SLACKS

PRIORITY DATA

The present application is a divisional application of U.S. application Ser. No. 14/250,448, filed Apr. 11, 2014, which is continuation application of U.S. application Ser. No. 13/456,939, filed Apr. 26, 2012, now U.S. Pat. No. 8,698, 252, each of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Field effect transistors (FETs) have been used in conventional IC design. Due to shrinking technology nodes, high-k (HK) dielectric material and metal are often considered to form a gate stack for a FET. Integration issues exist when forming various HK/metal-gate (MG) FETs onto a single IC chip, such as a HK/MG of p-type FET core, n-type FET core, input/output nFET, input/output pFET, and high-resistor. Thus, a process that provides flexibility and feasibility to fabricate various HK/MG structures is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
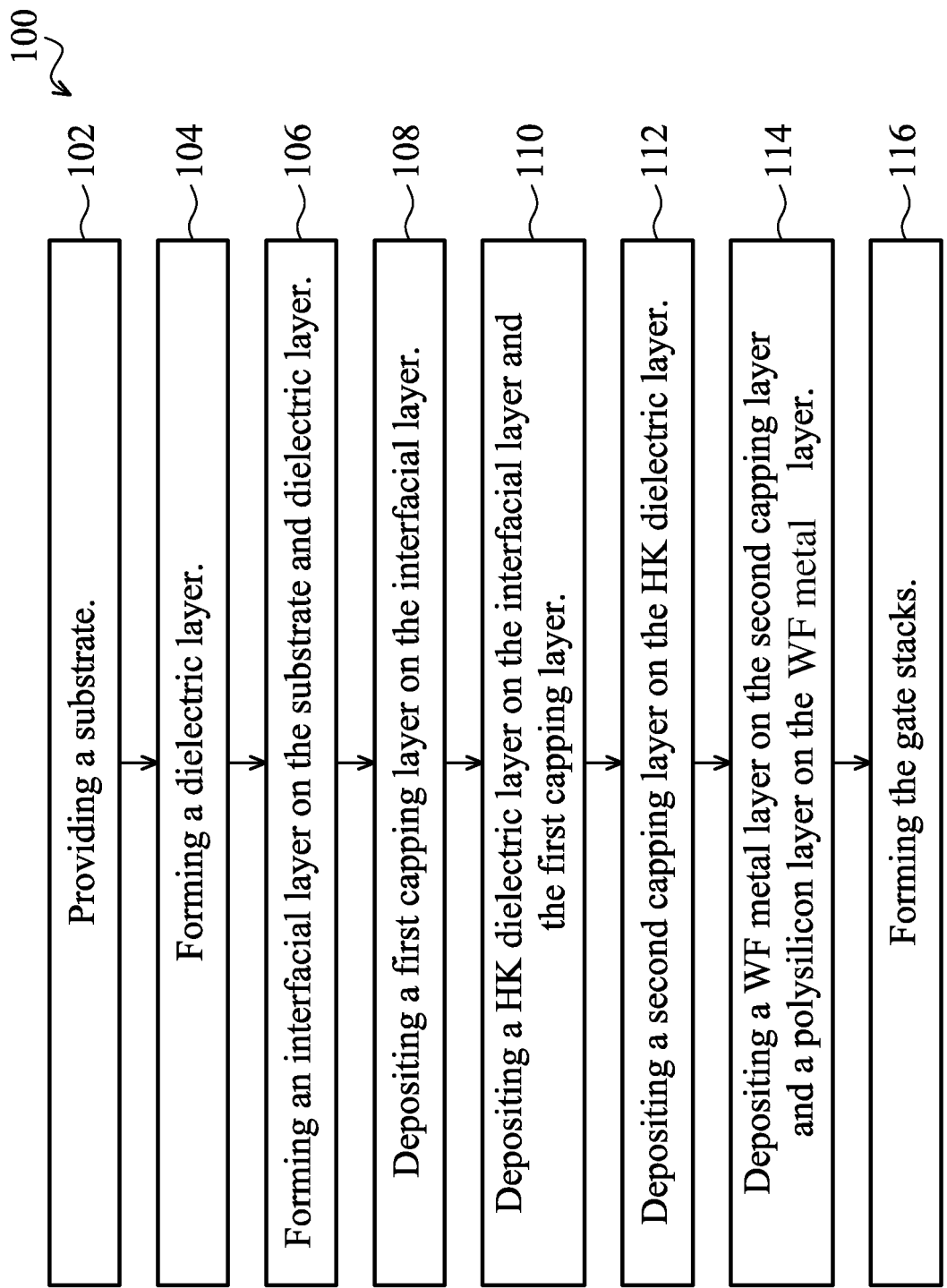
FIG. 1 is a flowchart of a method for making a semiconductor device having various gate stacks in one embodiment constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 8:
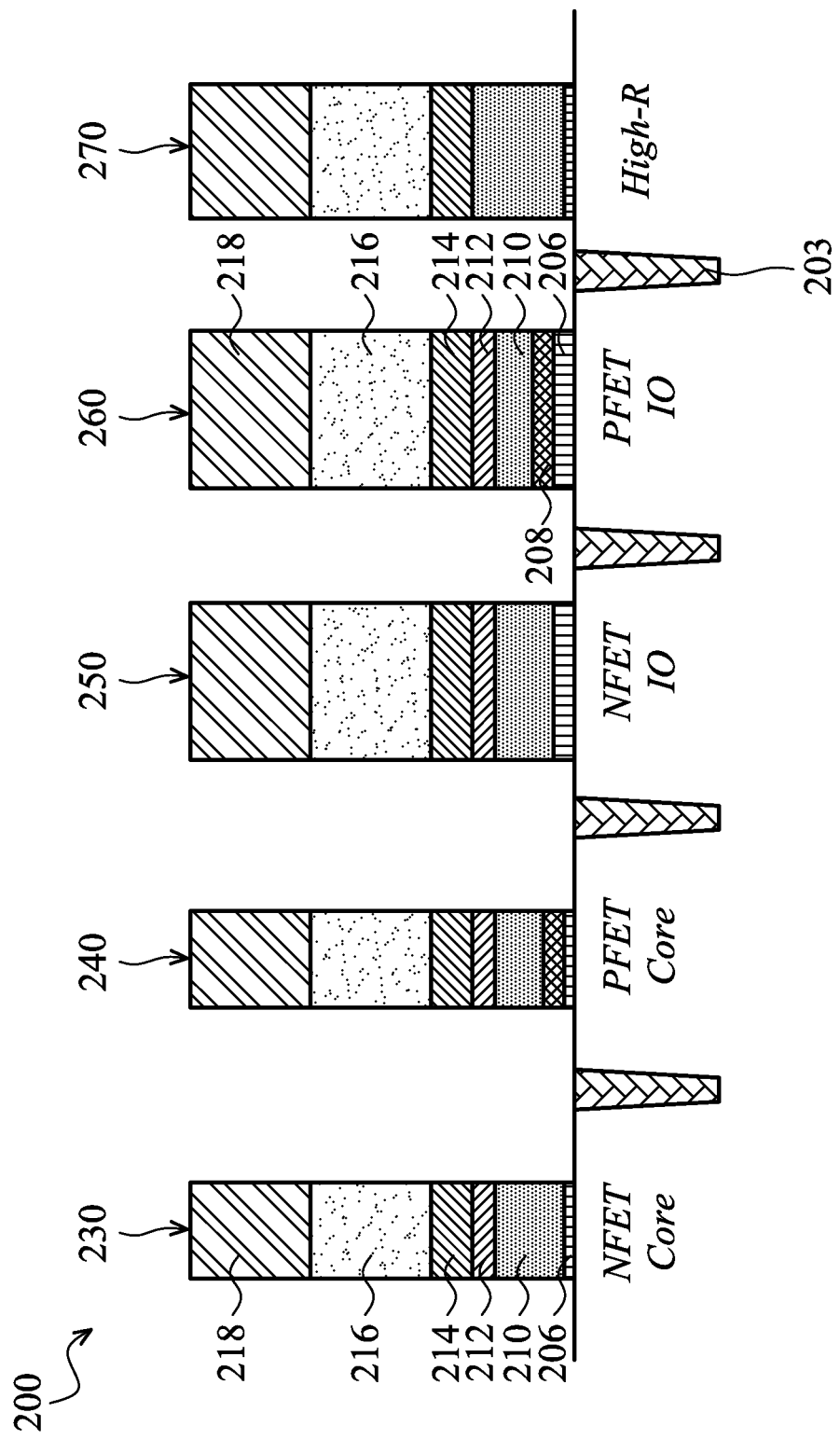
Figure 9:
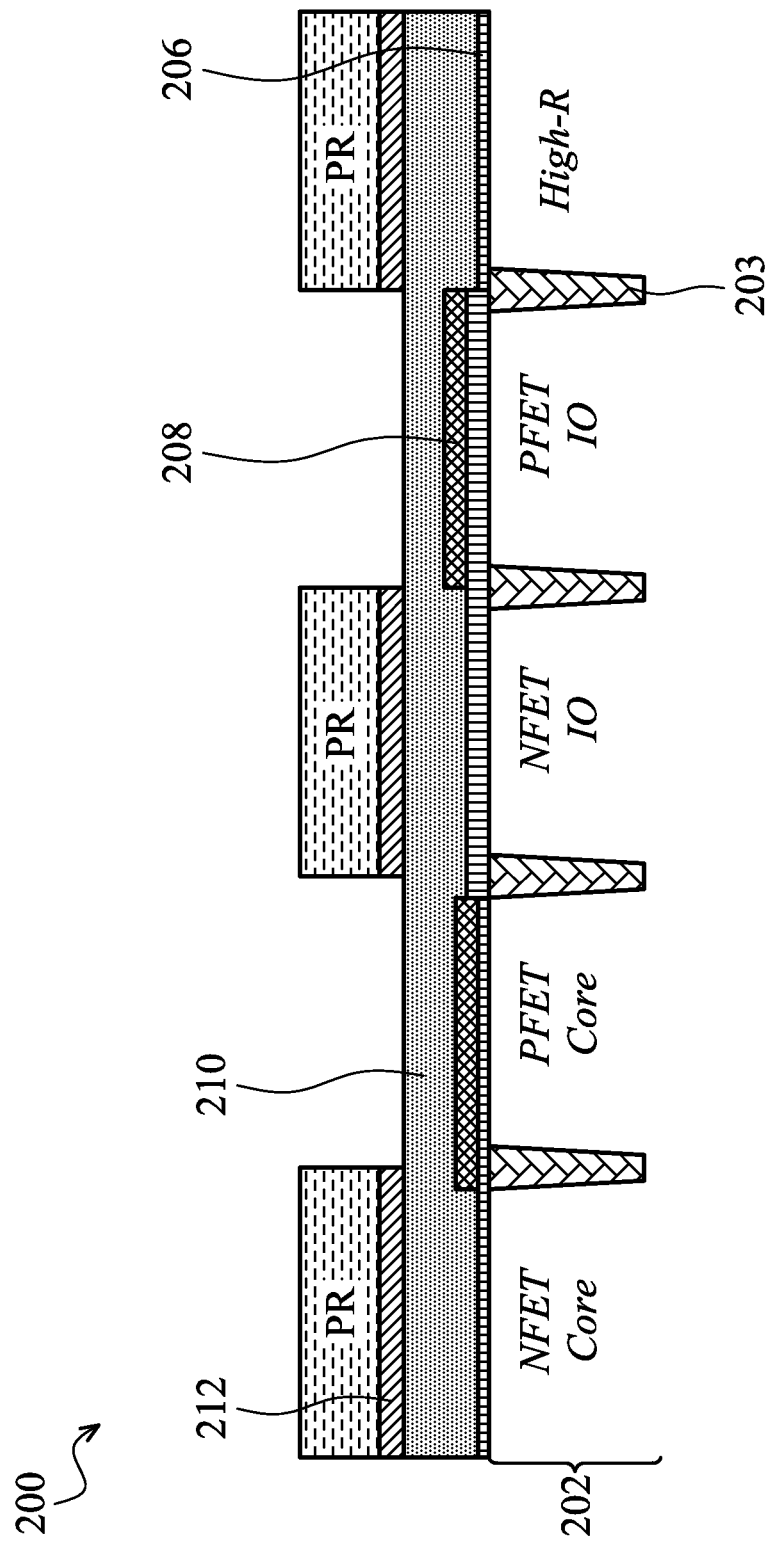
FIGS. 9-11 are sectional view of another embodiment of a semiconductor device having various gate stacks at various fabrication stages constructed according to various aspects of the present disclosure.
Figure 10:
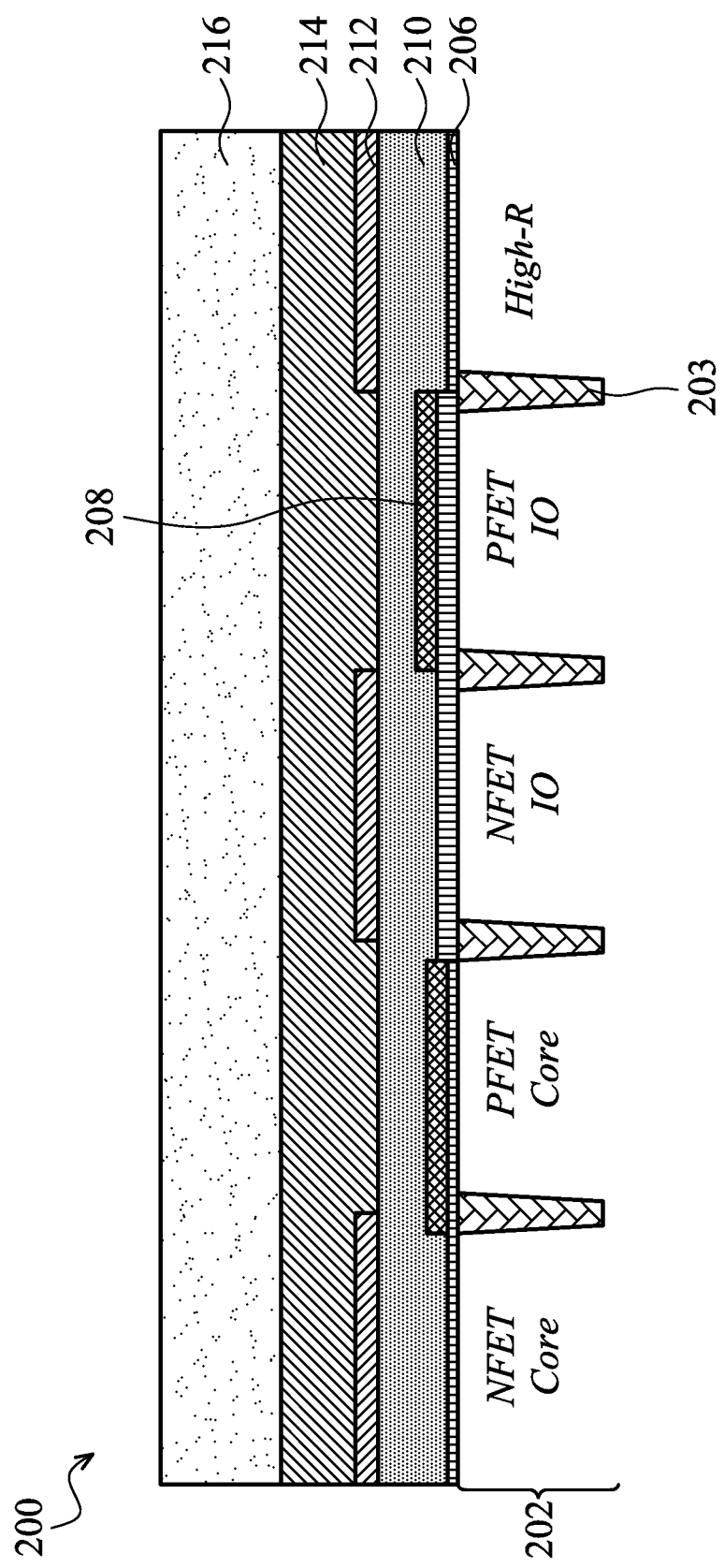
Figure 11:
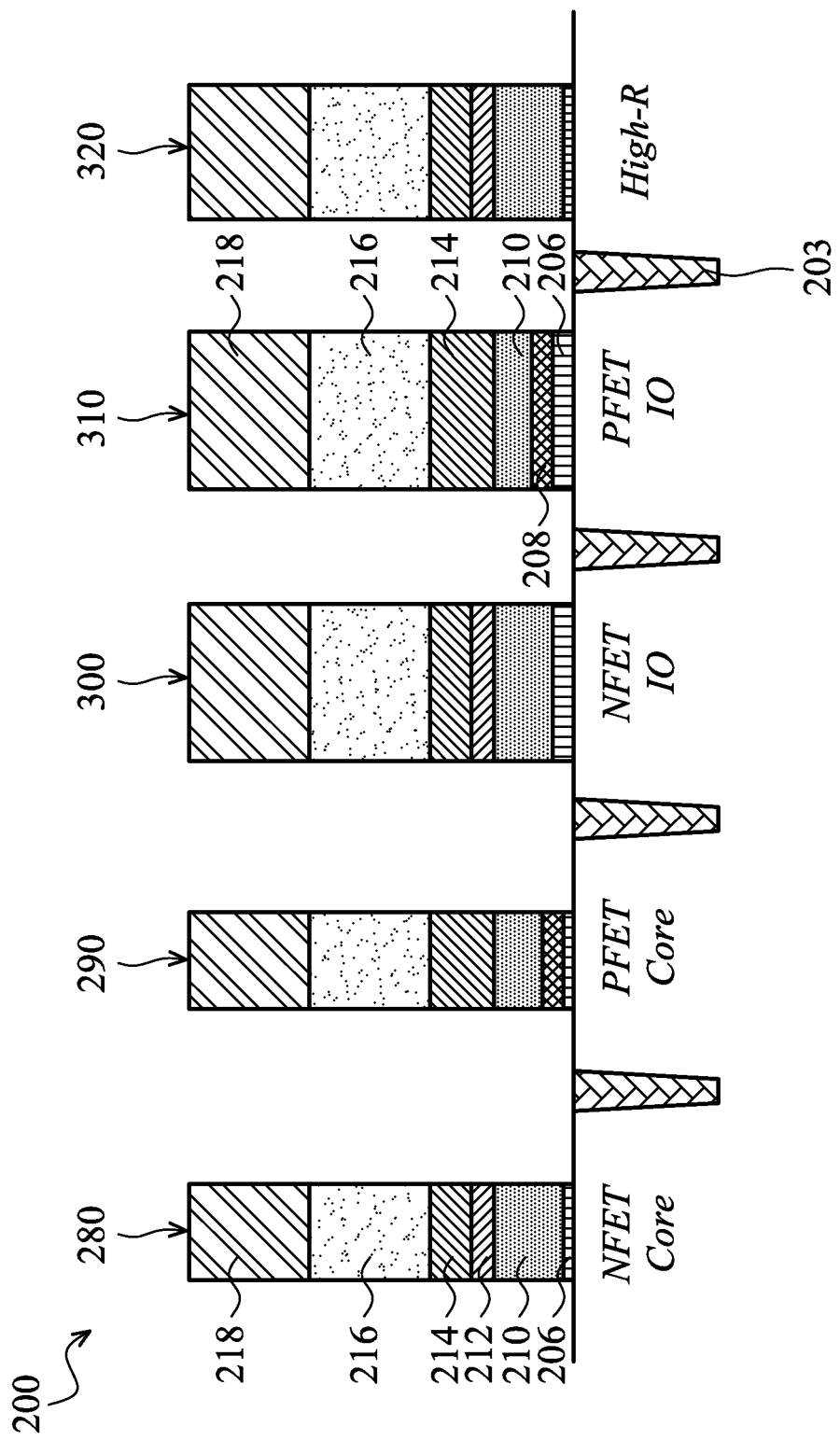
Figure 12:
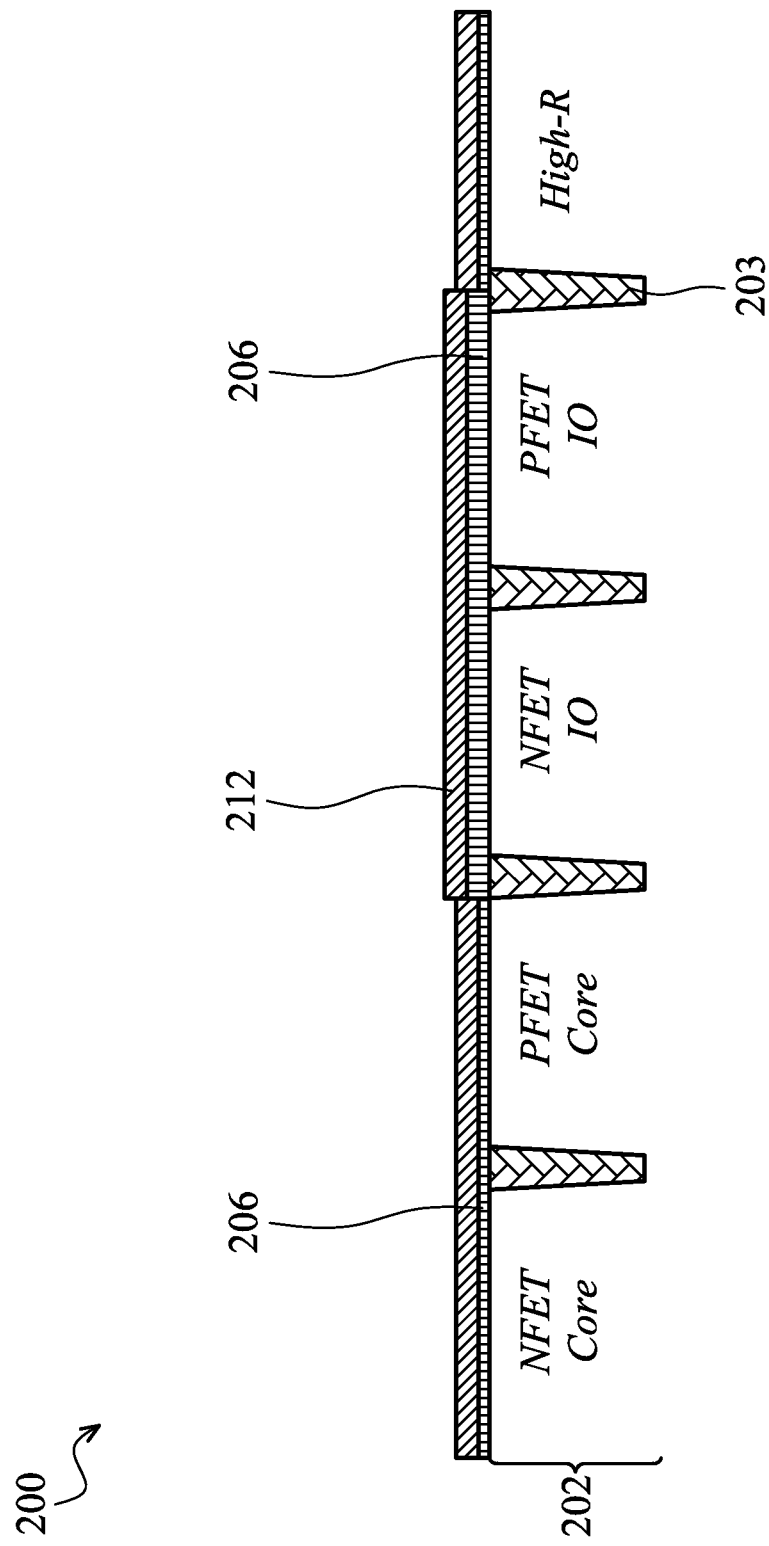
FIGS. 12-13 are sectional views of yet another embodiment of a semiconductor device having various gate stacks at various fabrication stages constructed according to various aspects of the present disclosure.
Figure 13:
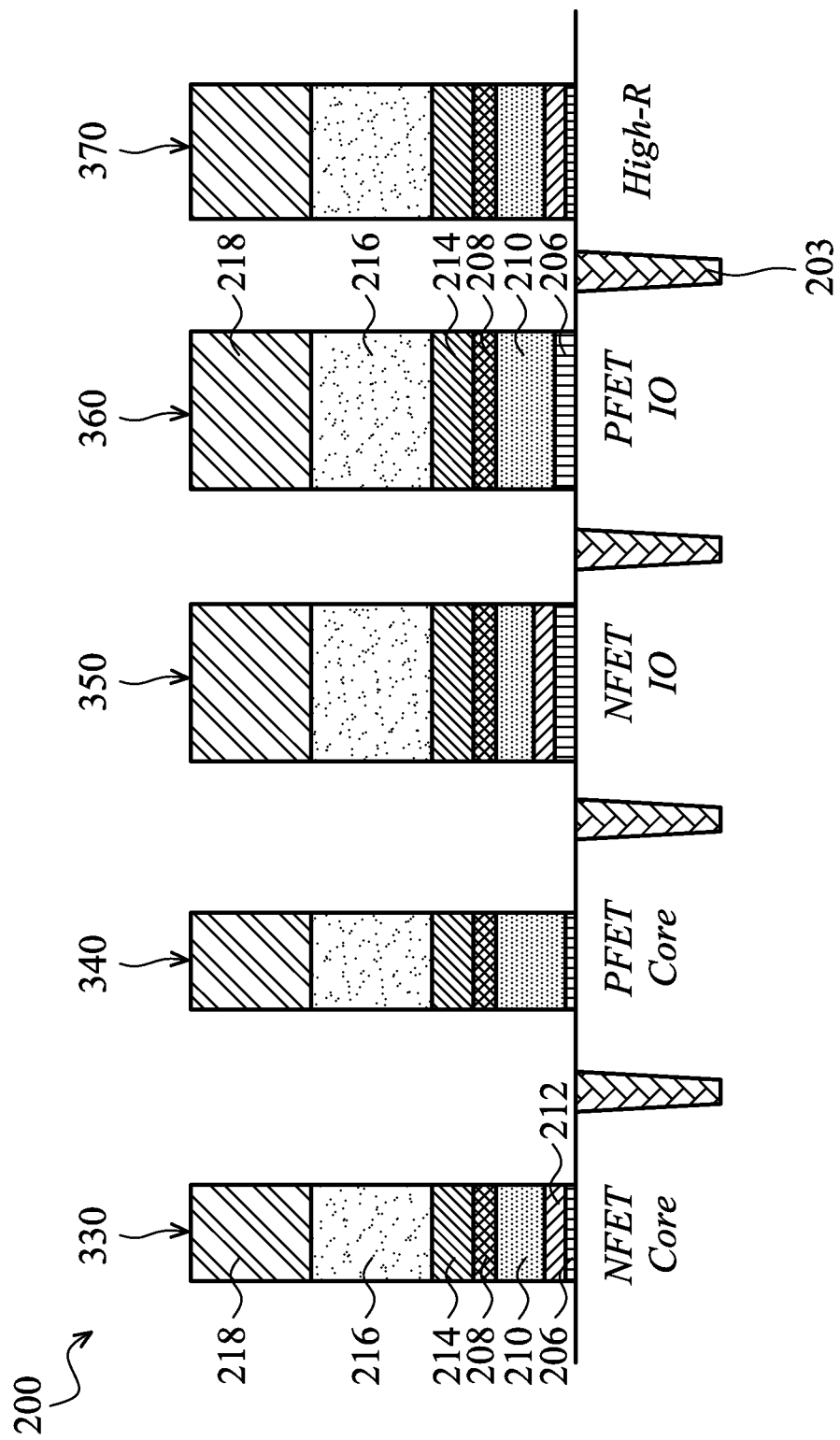
Figure 14:
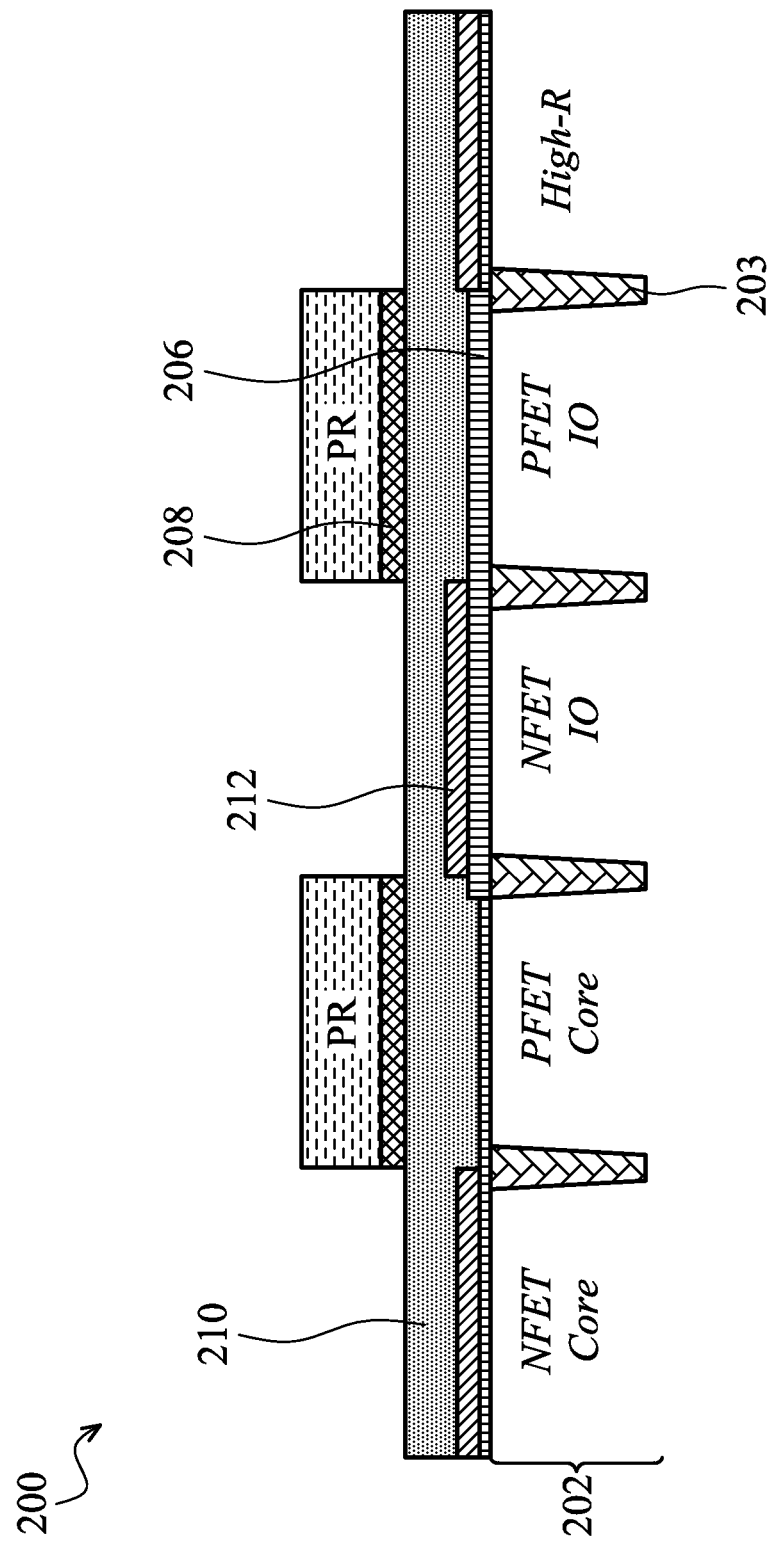
FIG. 14-15 are sectional views of one more embodiment of a semiconductor device having various gate stacks at various fabrication stages constructed according to various aspects of the present disclosure.
Figure 15:
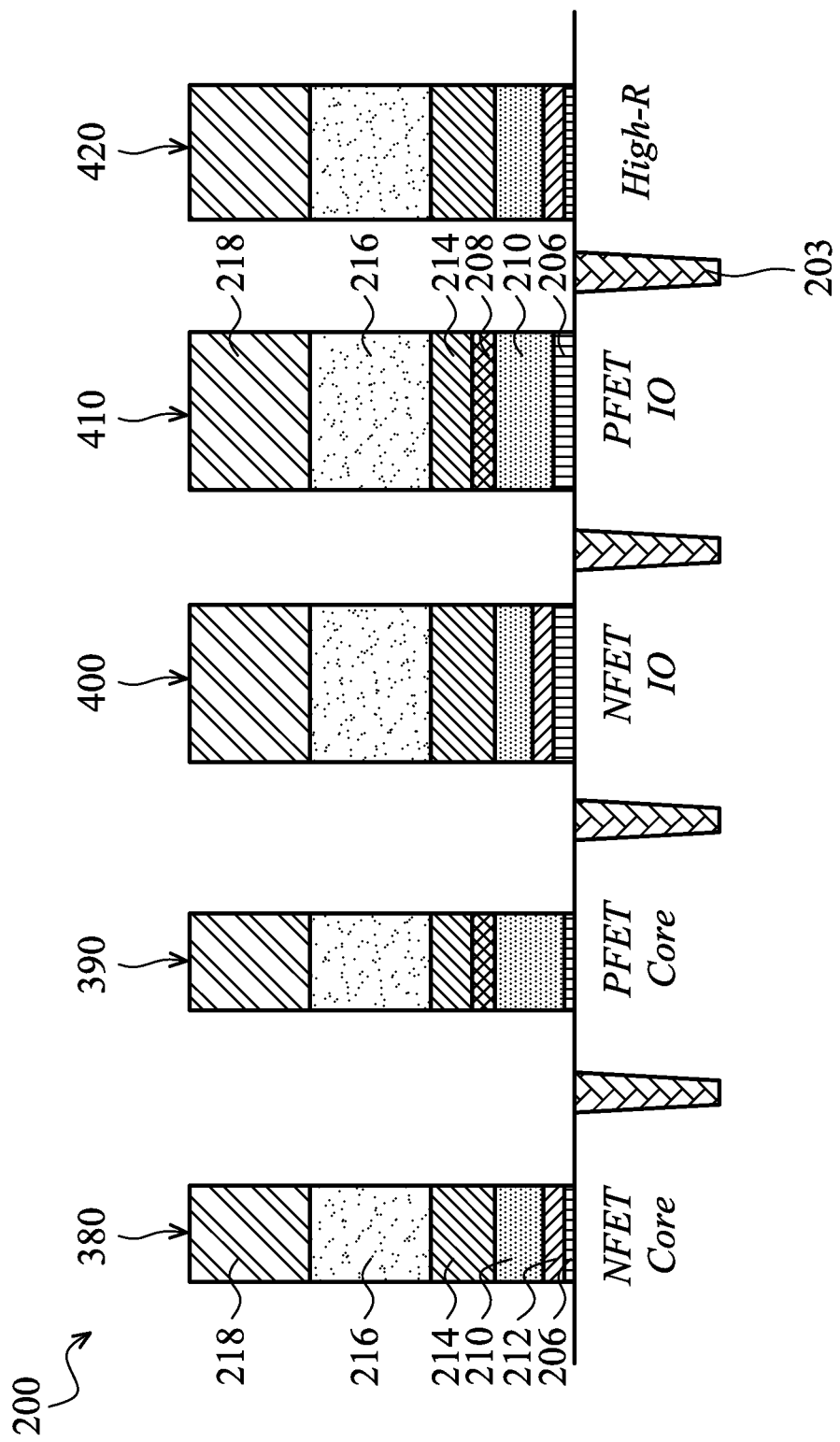

FIG. 1 is a flowchart of one embodiment of a method 100 making a semiconductor device 200 having gate stacks constructed according to aspects of the present disclosure. FIGS. 2-8 are sectional views of one embodiment of a semiconductor device 200 having gate stacks at various fabrication stages. FIGS. 9-11 are sectional views of another embodiment of a semiconductor device 200. FIGS. 12-13 are sectional views of yet another embodiment of a semiconductor device 200. FIGS. 14-15 are sectional views of one more embodiment of a semiconductor device 200. The semiconductor device 200 and the method 100 of making the same are collectively described with reference to FIGS. 1 through 15.

The method 100 begins at step 102 by providing a semiconductor substrate 202. The semiconductor substrate 202 includes silicon. Alternatively, the substrate 202 includes germanium or silicon germanium. Also alternatively, the semiconductor substrate 202 may include an epitaxial layer. For example, the semiconductor substrate 202 may have an epitaxial layer overlying a bulk semiconductor. Further, the semiconductor substrate 202 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the semiconductor substrate 202 may include a semiconductor-on-insulator (SOI) structure. Also alternatively, the semiconductor substrate 202 may include a buried dielectric layer, such as a buried oxide (BOX) layer, such as that formed by separation by implantation of oxygen (SIMOX) technology, wafer bonding, SEG, or other appropriate method.

The semiconductor substrate 202 also includes various doped regions such as n-well and p-wells formed by a proper technique, such as ion implantation. The semiconductor substrate also 202 includes various isolation features, such as shallow trench isolation (STI) 203, formed in the substrate to separate various device regions. The formation of the STI 203 may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI 203 may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

The semiconductor substrate 202 includes various device regions. The various device regions include various n-type and p-type field effect transistors and one or more resistors. In the present embodiment, the semiconductor substrate 202 includes an n-type field-effect transistor (nFET) core region, an input/output nFET (nFET IO) region, a p-type field-effect transistor (pFET) core region, an input/output pFET (pFET IO) region, and a high-resistor region.

Figure 2:
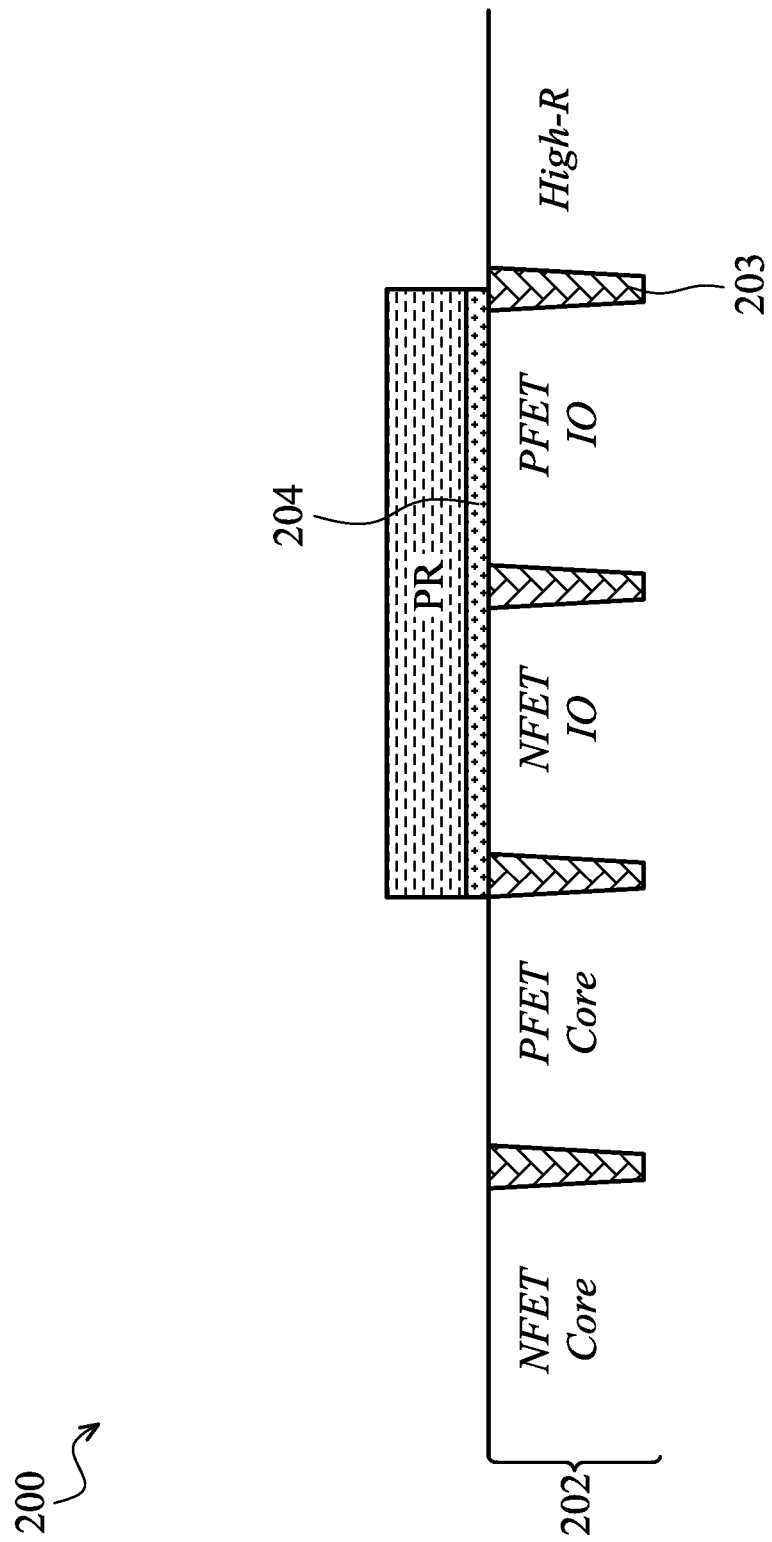
FIGS. 2-8 are sectional views of one embodiment of a semiconductor device having various gate stacks at various fabrication stages constructed according to various aspects of the present disclosure.
Figure 3:
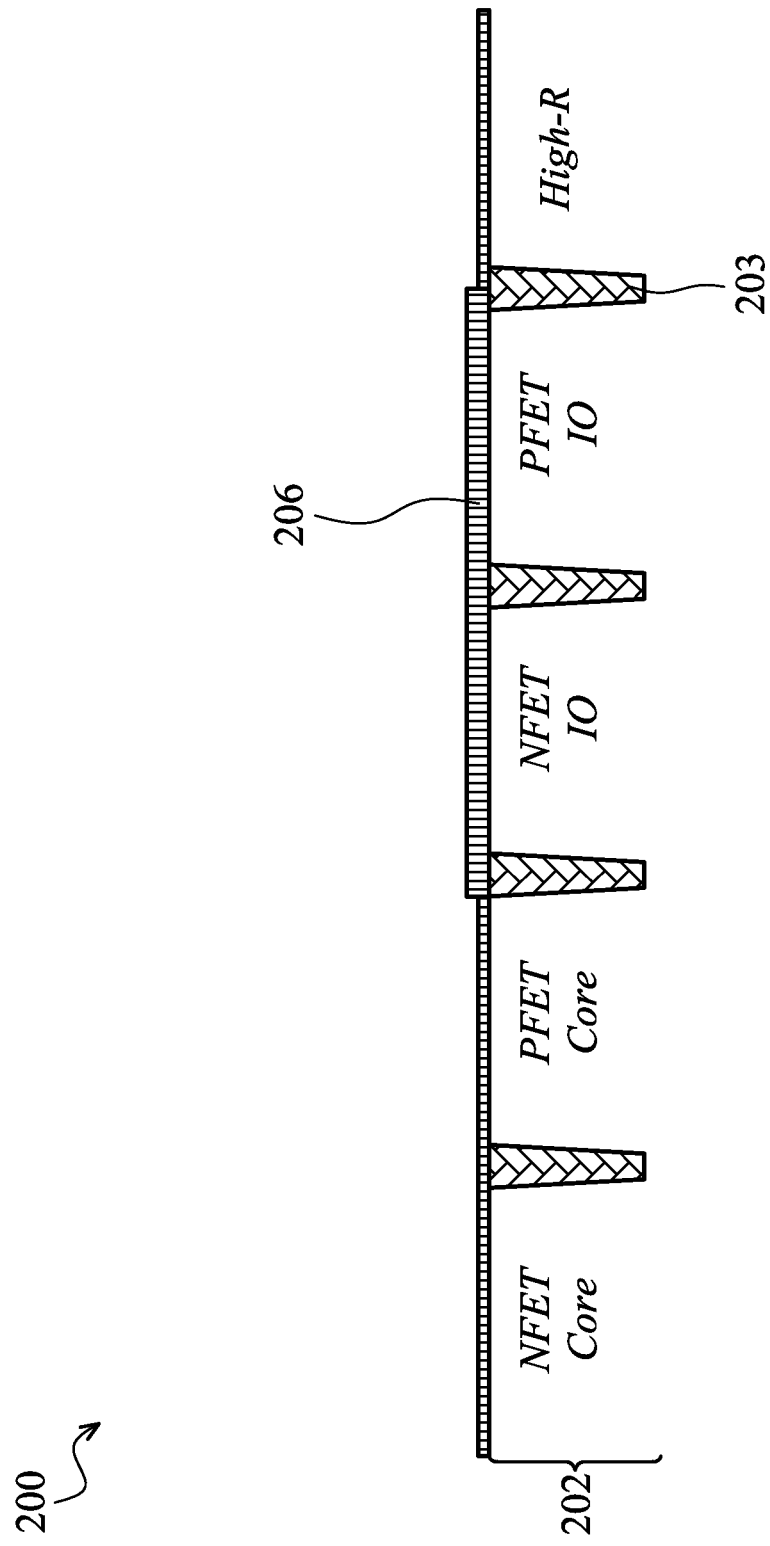

Referring to FIG. 2, the method 100 proceeds to step 104 by forming a dielectric layer 204 on the input/output regions of the semiconductor substrate 202 by suitable techniques, such as depositing, photoresist patterning and etching processes. The dielectric layer 204 includes chemical oxide, or any other suitable materials. In the next step 106 and FIG. 3, an interfacial layer 206 is formed on the substrate 202 and the dielectric layer 204 (not shown). The interfacial layer 206 may include silicon oxide formed by a proper technique, such as an atomic layer deposition (ALD), thermal oxidation, UV-Ozone Oxidation, or chemical vapor deposition (CVD).

Figure 4:
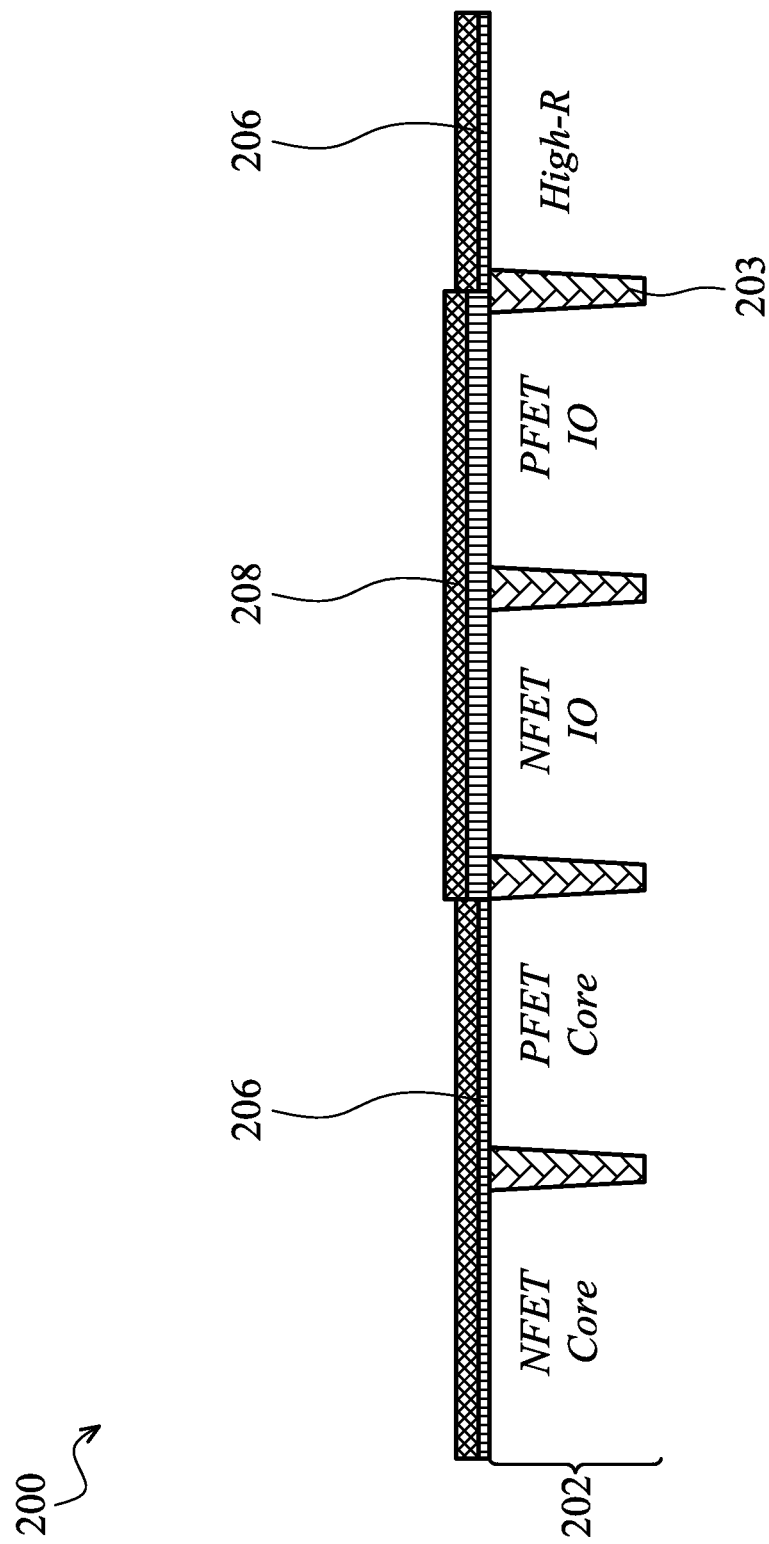

Moving to FIG. 4, in step 108, a capping layer of a first material 208 is deposited on the interfacial layer 206. The capping layer 208 may include a p-type work function metal or metal oxide, including $Al_2O_3$, MgO, CaO, or mixtures thereof. In the present embodiment, capping layer 208 includes aluminum oxide. The capping layer 208 is formed by a suitable technique, such as ALD, CVD, or physical vapor deposition (PVD). In one embodiment, the capping layer 208 has a thickness of less than 50 angstroms.

Figure 5:
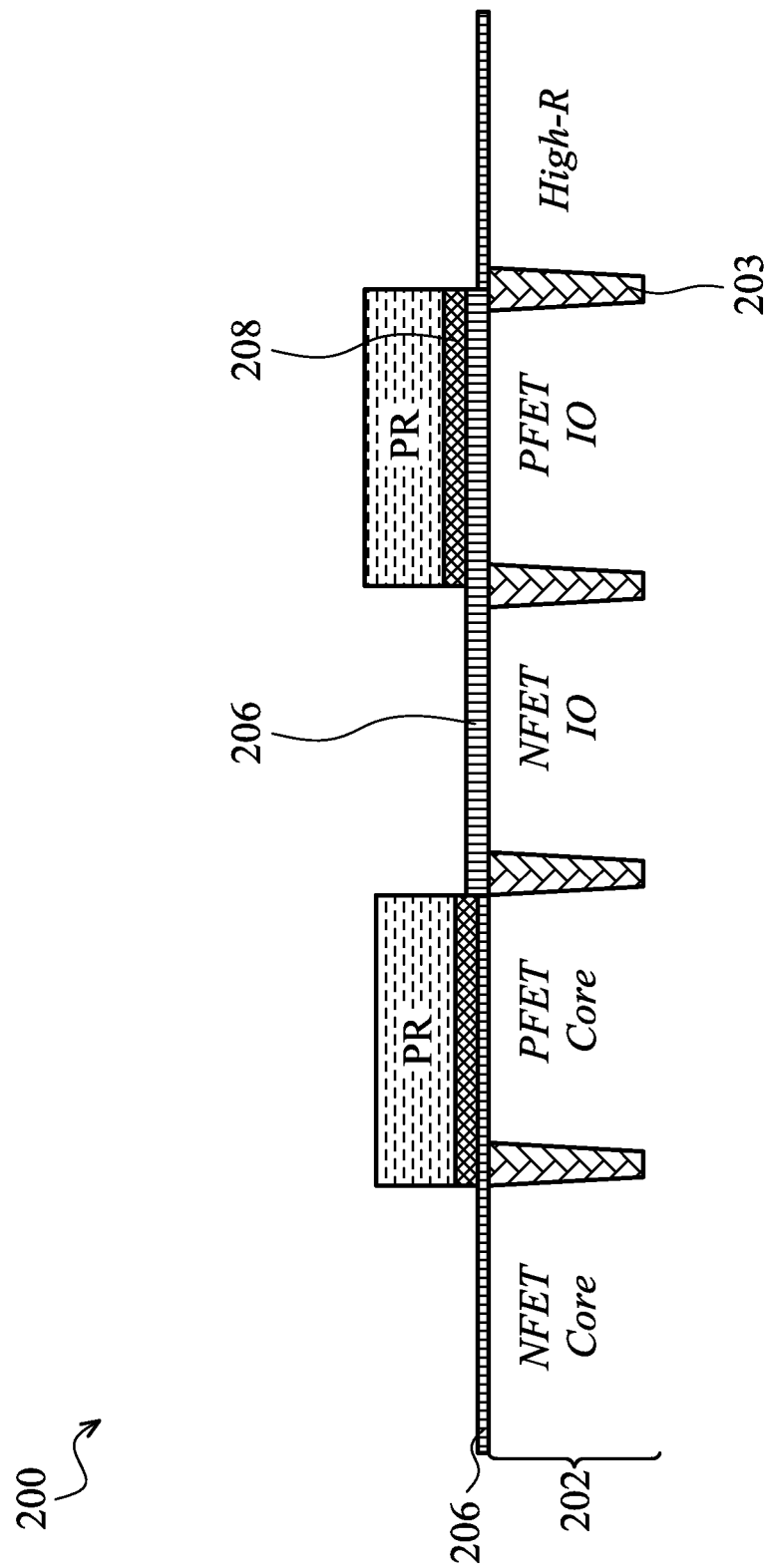

In FIG. 5, the capping layer 208 is patterned using lithography and etching processes so as to remove the capping layer 208 from the nFET core region, nFET IO region, and high-resistor region of the substrate 202. An exemplary lithography process may include photoresist patterning, developing, and photoresist stripping. In this process, a patterned photoresist layer is formed on capping layer 208. The patterned photoresist layer includes various openings that expose portions of the capping layer 208 to subsequent etch. The etching process includes a dry etch, a wet etch, or a combination of dry etch and wet etch. The dry etching process may implement a, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile.

Figure 6:
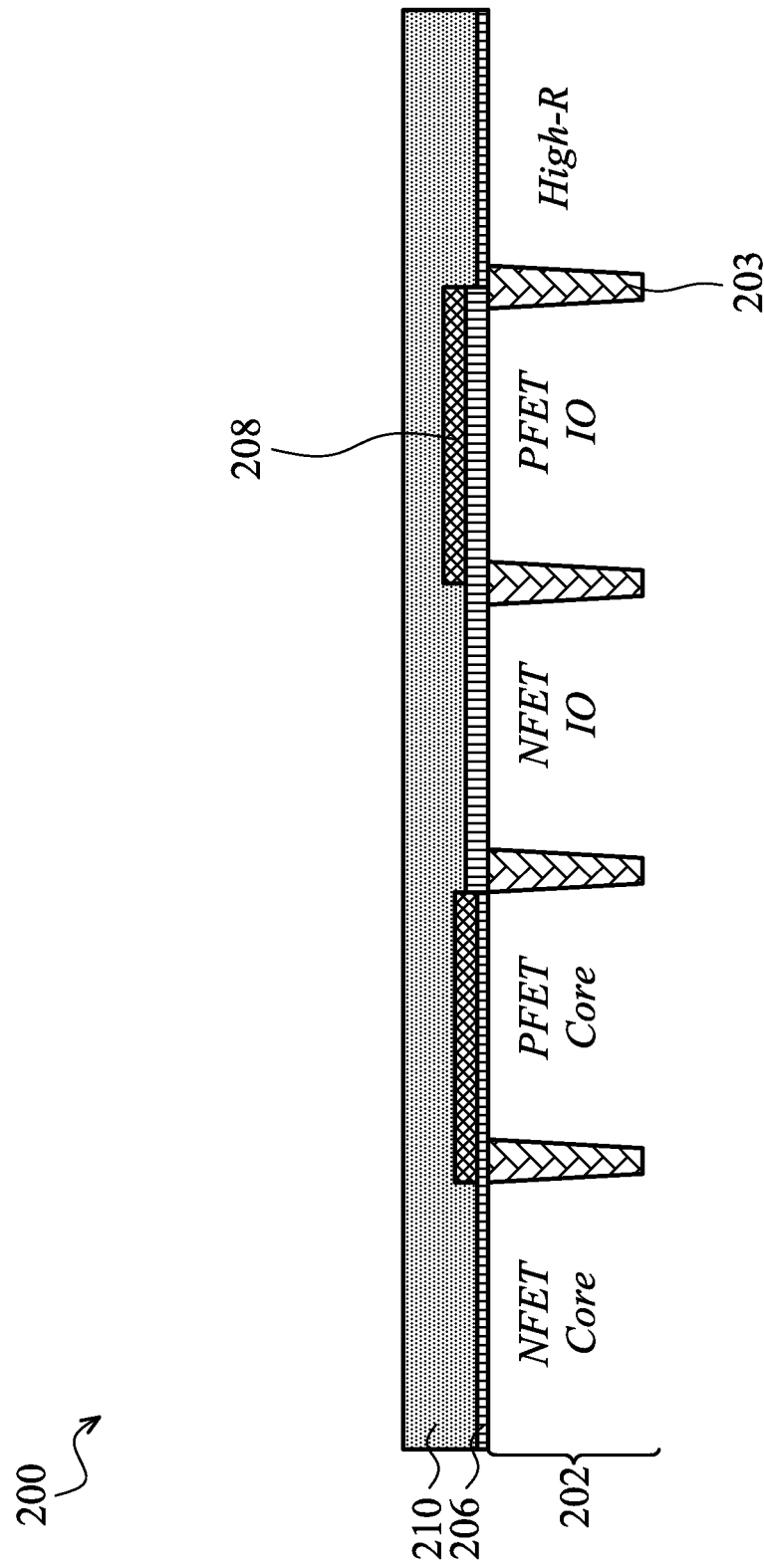

Referring now to step 110 and FIG. 6, a high-k (HK) dielectric layer 210 is deposited on the interfacial layer 206 in the nFET core, nFET IO, and high-resistor regions, and on the capping layer of the first material 208 in the pFET core and pFET IO regions. The HK dielectric layer 210 may include HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The HK dielectric layer 210 is formed by a suitable process such as ALD, PVD, or CVD. Other methods to form the HK dielectric layer 210 include metal organic chemical vapor deposition (MOCVD) or UV-Ozone Oxidation or molecular beam epitaxy (MBE). In one embodiment, the HK dielectric layer 210 has a thickness of less than 50 angstroms.

Figure 7:
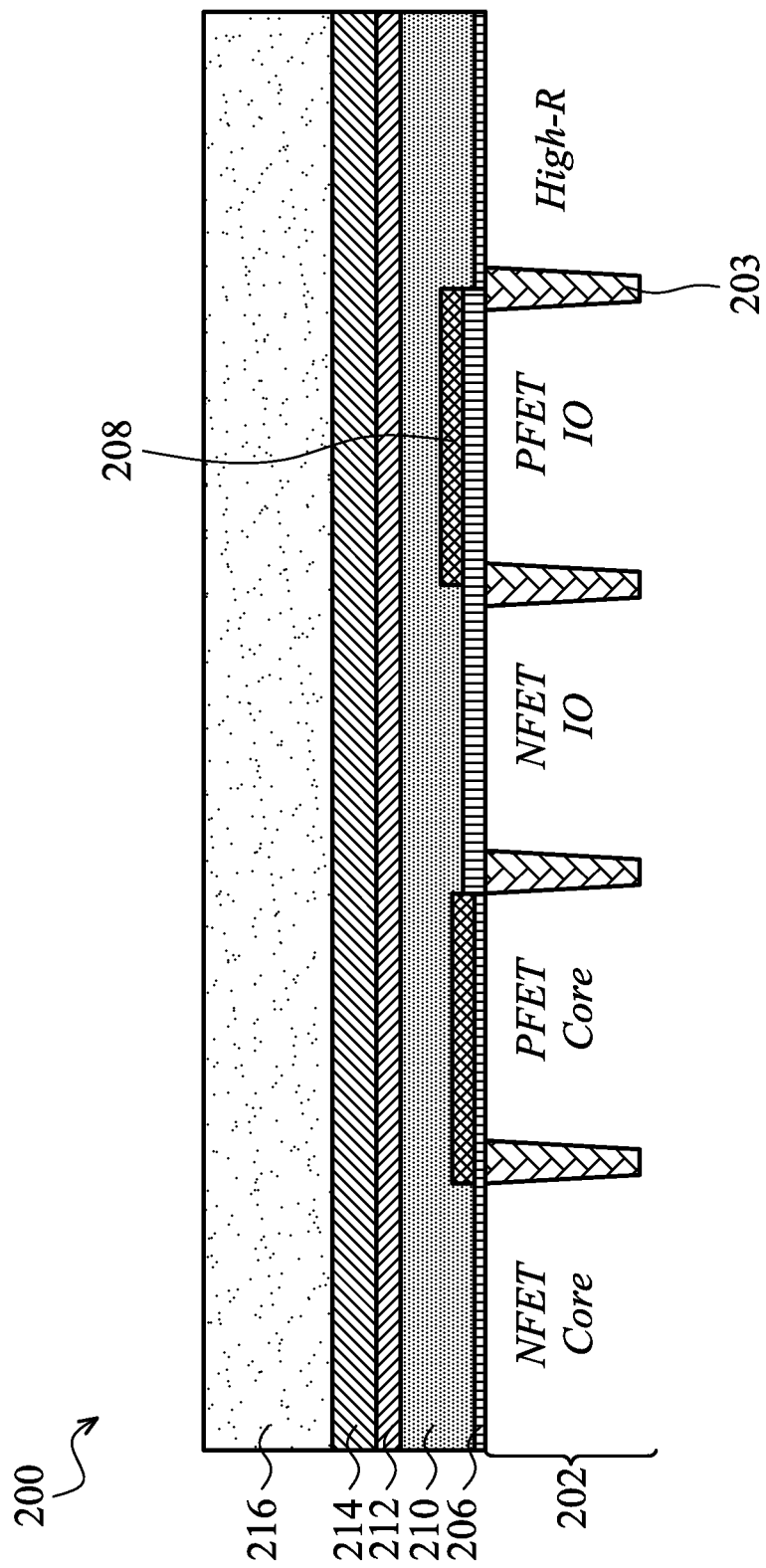

In FIG. 7 and step 112, a capping layer of a second material 212 is deposited on the HK dielectric layer 210. The capping layer 212 may include an n-type work function metal or metal oxide, including $La_2O_3$, $Sc_2O_3$, $Y_2O_3$, SrO, BaO, $Ta_2O_5$, $TiO_2$, $LaAlO_3$, $ZrO_2$, $Gd_2O_3$, or mixtures thereof. In the present embodiment, capping layer 212 includes lanthanum oxide. The capping layer 212 is formed by a suitable technique, such as ALD, CVD, or PVD. In one embodiment, the capping layer 212 has a thickness of less than 50 angstroms.

Proceeding to step 114, a work function (WF) metal layer 214 is deposited on the capping layer 212 and a polysilicon layer 216 is deposited on the WF metal layer 214. In the present embodiment, the WF metal layer 214 includes titanium nitride (TiN) formed by a suitable technique, such as PVD, ALD, or CVD. In other embodiments, the WF metal layer 214 includes tantalum nitride (TaN), tungsten nitride (WN), or combinations thereof. In one embodiment, the metal layer 214 has a thickness of less than 200 angstroms.

The polysilicon (or amorphous silicon) layer 216 may be formed by CVD with precursor silane ($SiH_4$) or other silicon based precursor. The deposition of the amorphous silicon may be performed at a raised temperature. In one example, the deposition temperature is greater than about 400° C. The polysilicon (or amorphous) layer 216 may be in situ doped using the precursor including dopant-containing gas according to one embodiment.

The method 100 proceeds to step 116 by forming the different gate stacks by patterning and etching processes. In FIG. 8, the gate layers are patterned to form five different gate stacks including a first gate stack 230 on the nFET core region, a second gate stack 240 on the pFET core region, a third gate stack 250 on the nFET IO region, a fourth gate stack 260 on the pFET IO region, and a fifth gate stack 270 on the high-resistor region. In the present embodiment, the first gate stack 230 includes, in order from bottom to top, interfacial layer 206, HK dielectric layer 210, capping layer of the second material 212, WF metal layer 214, and polysilicon layer 216. The second gate stack 240 includes, in order from bottom to top, interfacial layer 206, capping layer of the first material 208, HK dielectric layer 210, capping layer of the second material 212, WF metal layer 214, and polysilicon layer 216. The third gate stack 250 includes, in order from bottom to top, dielectric layer 204 (not shown), interfacial layer 206, HK dielectric layer 210, capping layer of the second material 212, WF metal layer 214, and polysilicon layer 216. The fourth gate stack 260 includes, in order from bottom to top, dielectric layer 204 (not shown), interfacial layer 206, capping layer of the first material 208, HK dielectric layer 210, capping layer of the second material 212, WF metal layer 214, and polysilicon layer 216. The fifth gate stack 270 includes, in order from bottom to top, interfacial layer 206, HK dielectric layer 210, capping layer of the second material 212, WF metal layer 214, and polysilicon layer 216.

The patterning processes to form the gate stacks includes a lithography patterning and etching processes. For example, the lithography patterning process includes forming a patterned photoresist, developing a photoresist, and photoresist stripping. In another embodiment, as seen in FIG. 8, the etching process may further use a hard mask layer 218 as an etch mask. In this case, a hard mask layer 218 is formed on the gate layers, a patterned photoresist layer (not shown) is formed on the hard mask layer 218, a first etch process is applied to the hard mask layer 218 to transfer the pattern from the patterned photoresist to the hard mask layer 218, and a second etch process is applied to the gate layers using the patterned hard mask as an etch mask. The hard mask layer 218 may include silicon nitride and/or silicon oxide.

As seen in FIG. 8, the second and fourth gate stacks 240, 260 on the pFET core and pFET IO regions respectively, include both capping layers of the first and second material 208, 212. The capping layer of the first material 208, which may have the p-type work function is in closer proximity to the substrate 202. The capping layer of the second material 212, which may have the n-type work function, is above capping layer 208, and farther from the substrate 202. The HK dielectric layer 210 is between the two capping layer 208, 212.

FIGS. 9 to 10 illustrate another embodiment of a method of making a semiconductor device 200. In this embodiment, an seen in FIG. 9, extra steps are included. Before depositing the WF metal layer 214 in step 114, the capping layer of the second material 212 is removed from the pFET core region and pFET IO region by using a photolithography and etching processes. The steps following this additional step (deposition of WF metal layer 214 and polysilicon layer 216) are substantially the same as those previously described for FIG. 7, and are shown in FIG. 10.

FIG. 11 illustrates the fabrication of the different gate stacks by a patterning and etching processes. Similar to FIG. 8, the gate layers are patterned to form five different gate stacks including a first gate stack 280 on the nFET core region, a second gate stack 290 on the pFET core region, a third gate stack 300 on the nFET IO region, a fourth gate stack 310 on the pFET IO region, and a fifth gate stack 320 on the high-resistor region.

In the present embodiment, the first gate stack 280 includes, in order from bottom to top, interfacial layer 206, HK dielectric layer 210, capping layer of the second material 212, WF metal layer 214, and polysilicon layer 216. The second gate stack 290 includes, in order from bottom to top, interfacial layer 206, capping layer of the first material 208, HK dielectric layer 210, WF metal layer 214, and polysilicon layer 216. The third gate stack 300 includes, in order from bottom to top, dielectric layer 204 (not shown), interfacial layer 206, HK dielectric layer 210, capping layer of the second material 212, WF metal layer 214, and polysilicon layer 216. The fourth gate stack 310 includes, in order from bottom to top, dielectric layer 204 (not shown), interfacial layer 206, capping layer of the first material 208, HK dielectric layer 210, WF metal layer 214, and polysilicon layer 216. The fifth gate stack 320 includes, in order from bottom to top, interfacial layer 206, HK dielectric layer 210, capping layer of the second material 212, WF metal layer 214, and polysilicon layer 216.

Referring now to FIG. 12, another embodiment of method 100 is described. The method 100 proceeds through steps 102-106 as previously described with reference to FIGS. 1-3. In this embodiment, the method is substantially the same as the method described with respect to FIGS. 4-7, except that the positions of the capping layer of the first material 208 and capping layer of the second material 212 in the process flow are reversed. For example, FIG. 12 is the same as FIG. 4, but capping layer 212 is deposited first instead of capping layer 208. Also, in this embodiment, the capping layer 212 is removed from the pFET core and pFET IO regions instead of from the nFET core and nFET IO regions as was the case for capping layer 208 in FIG. 5. The method proceeds through steps 108-114 as previously described.

At step 116 and FIG. 13, different gate stacks are formed by a patterning and etching process as previously described. The gate layers are patterned to form five different gate stacks including a first gate stack 330 on the nFET core region, a second gate stack 340 on the pFET core region, a third gate stack 350 on the nFET IO region, a fourth gate stack 360 on the pFET IO region, and a fifth gate stack 370 on the high-resistor region.

In the present embodiment, the first gate stack 330 includes, in order from bottom to top, interfacial layer 206, capping layer of the second material 212, HK dielectric layer 210, capping layer of the first material 208, WF metal layer 214, and polysilicon layer 216. The second gate stack 340 includes, in order from bottom to top, interfacial layer 206, HK dielectric layer 210, capping layer of the first material 208, WF metal layer 214, and polysilicon layer 216. The third gate stack 350 includes, in order from bottom to top, dielectric layer 204 (not shown), interfacial layer 206, capping layer of the second material 212, HK dielectric layer 210, capping layer of the first material 208, WF metal layer 214, and polysilicon layer 216. The fourth gate stack 360 includes, in order from bottom to top, dielectric layer 204 (not shown), interfacial layer 206, HK dielectric layer 210, capping layer of the first material 208, WF metal layer 214, and polysilicon layer 216. The fifth gate stack 370 includes, in order from bottom to top, interfacial layer 206, capping layer of the second material 212, HK dielectric layer 210, capping layer of the first material 208, WF metal layer 214, and polysilicon layer 216.

As seen in FIG. 13, the first and third gate stacks 330, 350 on the nFET core and nFET IO regions respectively, include both capping layers of the first and second material 208, 212. The capping layer of the second material 212, which may have the n-type work function is in closer proximity to the substrate 202. The capping layer of the first material 208, which may have the p-type work function, is above the capping layer 212, and farther from the substrate 202. The HK dielectric layer 210 is between the capping layers 208, 212.

FIG. 14 illustrates another embodiment of a method of making a semiconductor device 200. In this embodiment, the method is substantially the same as the method described with respect to FIGS. 9-10, except that the positions of the capping layer of the first material 208 and capping layer of the second material 212 in the process flow are reversed. In this embodiment, the capping layer 208 is removed from the nFET core and nFET core regions instead of from the pFET core and pFET IO regions as was the case for capping layer 212 in FIG. 9.

FIG. 15 illustrates the fabrication of the different gate stacks by a patterning and etching process. Similar to FIG. 13, the gate layers are patterned to form five different gate stacks including a first gate stack 380 on the nFET core region, a second gate stack 390 on the pFET core region, a third gate stack 400 on the nFET IO region, a fourth gate stack 410 on the pFET IO region, and a fifth gate stack 420 on the high-resistor region.

In the present embodiment, the first gate stack 380 includes, in order from bottom to top, interfacial layer 206, capping layer of the second material 212, HK dielectric layer 210, WF metal layer 214, and polysilicon layer 216. The second gate stack 390 includes, in order from bottom to top, interfacial layer 206, HK dielectric layer 210, capping layer of the first material 208, WF metal layer 214, and polysilicon layer 216. The third gate stack 400 includes, in order from bottom to top, dielectric layer 204 (not shown), interfacial layer 206, capping layer of the second material 212, HK dielectric layer 210, WF metal layer 214, and polysilicon layer 216. The fourth gate stack 410 includes, in order from bottom to top, dielectric layer 204 (not shown), interfacial layer 206, HK dielectric layer 210, capping layer of the first material 208, WF metal layer 214, and polysilicon layer 216. The fifth gate stack 420 includes, in order from bottom to top, interfacial layer 206, capping layer of the second material 212, HK dielectric layer 210, WF metal layer 214, and polysilicon layer 216.

Various advantages may be present in one or more embodiments of the method 100 and the semiconductor device 200. The present disclosure provides a new integration scheme for a gate first process design. The methods provide four kinds of process flows that may be used to fabricate various kinds of semiconductor devices. The methods are flexible because they allow different devices to be fabricated by changing the sequence of the n/p capping layer deposition and patterning. The methods are efficient because a variety of gate stacks can be formed at the same time, i.e., layers of the same material for each gate stack are deposited at the same time. The present methods and devices provide a feasible integration flow that can integrate CMOS devices with Core/IO/Resistors and maintain the reasonable threshold voltage of NMOS and PMOS at the same time.

One of the broader forms of the present disclosure relates to a semiconductor device. The device includes a substrate and isolation features to separate different regions on the substrate. The device further includes five different gate stacks on the different regions. A p-type field-effect transistor (pFET) core region has a first gate stack on the substrate that includes an interfacial layer, a capping layer of a first material on the interfacial layer, and a high k (HK) dielectric layer on the capping layer of the first material. An input/output pFET (pFET IO) region has a second gate stack that includes a dielectric layer, an interfacial layer on the dielectric layer, a capping layer of the first material on the interfacial layer, and a HK dielectric layer on the capping layer of the first material. An n-type field-effect transistor (nFET) core region has a third gate stack on the substrate that includes an interfacial layer, a HK dielectric layer on the interfacial layer, and a capping layer of a second material on the HK dielectric layer. An input/output nFET (nFET IO) region has a fourth gate stack that includes a dielectric layer, an interfacial layer on the dielectric layer, a HK dielectric layer on the interfacial layer, and a capping layer of the second material on the HK dielectric layer. A high-resistor region has a fifth gate stack that includes an interfacial layer, a HK dielectric layer on the interfacial layer, and a capping layer of a second material on the HK dielectric layer.

Another one of the broader forms of the present disclosure involves another semiconductor device. The device includes a semiconductor substrate and isolation features to separate different regions on the substrate. The device further includes five different gate stacks on the different regions. A p-type field-effect transistor (pFET) core region has a first gate stack that includes an interfacial layer, a high k (HK) dielectric layer on the interfacial layer, and a capping layer of a first material on the HK dielectric layer. An input/output pFET (pFET IO) region has a second gate stack that includes a dielectric layer, an interfacial layer on the dielectric layer, a HK dielectric layer on the interfacial layer, and a capping layer of the first material on the HK dielectric layer. An n-type field-effect transistor (nFET) core region has a third gate stack that includes an interfacial layer, a capping layer of a second material on the interfacial layer, and a HK dielectric layer on the capping layer of the second material. An input/output nFET (nFET IO) region has a fourth gate stack that includes a dielectric layer, an interfacial layer on the dielectric layer, a capping layer of the second material on the interfacial layer, and a HK dielectric layer on the capping layer of the second material. A high-resistor region has a fifth gate stack that includes an interfacial layer, a capping layer of the second material on the interfacial layer, and a HK dielectric layer on the capping layer of the second material.

The present disclosure also describes a method of fabricating a semiconductor device. The method includes providing a semiconductor substrate having regions for an n-type field-effect transistor (nFET) core, an input/output nFET (nFET IO), a p-type field-effect transistor (pFET) core, an input/output pFET (pFET IO), and a high-resistor, forming an oxide layer on the IO region of the substrate, forming an interfacial layer on the substrate and the oxide layer, depositing a capping layer of a first material on the interfacial layer, depositing a high-k (HK) dielectric layer on the capping layer of the first material and the interfacial layer, depositing a capping layer of a second material on the HK dielectric layer, depositing a work function (WF) metal layer on the capping layer of the second material, depositing a polysilicon layer on the WF metal layer, and forming gate stacks on the regions of the substrate.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a semiconductor device, the method comprising:
   providing a semiconductor substrate having regions for an n-type field-effect transistor (nFET) core, an input/output nFET (nFET IO), a p-type field-effect transistor (pFET) core, an input/output pFET (pFET IO), and a high-resistor;
   forming an oxide layer on the IO regions of the substrate;
   forming an interfacial layer on the substrate and the oxide layer;
   depositing a capping layer of a first material on the interfacial layer;
   depositing a high-k (HK) dielectric layer on the capping layer of the first material and the interfacial layer;
   depositing a capping layer of a second material on the HK dielectric layer;
   depositing a work function (WF) metal layer on the capping layer of the second material;
   depositing a polysilicon layer on the WF metal layer;
   forming an nFET transistor in the nFET core region, the nFET including the interfacial layer, the capping layer of the first material deposited on the interfacial layer, the high-k dielectric layer deposited over the interfacial layer, the WF metal layer deposited over the HK dielectric layer, and the polysilicon layer deposited over the WF metal layer; and forming a pFET transistor in the pFET core region, the pFET transistor including the interfacial layer, the HK dielectric layer deposited over the interfacial layer and physically contacting the interfacial layer, the WF metal layer deposited over the HK dielectric layer, and the polysilicon layer deposited over the WF metal layer.

2. The method of claim 1, further comprising removing the capping material of the first material from the pFET core, pFET IO, and high-resistor regions before depositing the HK dielectric layer.

3. The method of claim 1, further comprising removing the capping layer of the first material from the pFET core and pFET IO regions before depositing the HK dielectric layer.

4. The method of claim 1, further comprising removing the capping material of the second material from the nFET core and nFET IO regions before depositing the WF metal layer.

5. The method of claim 1, further comprising removing the capping layer of the second material from the nFET core, nFET IO, and high-resistor regions before depositing the WF metal layer.

6. The method of claim 1, wherein the first and second materials comprises a p-type or n-type work function metal or metal oxide.

7. The method of claim 1, wherein the HK dielectric layer is formed between the capping layer of the first material and the capping layer of the second material.

8. A method comprising:
providing a substrate having a first field-effect transistor region of a first-type of conductivity, a first input/output region of the first-type of conductivity, a second field-effect transistor region of a second-type of conductivity, and a second input/output region of the second-type of conductivity;
forming an interfacial layer in the first field-effect transistor region, the first input/output region, the second field-effect transistor region, and the second input/output region;
forming a first capping layer over the interfacial layer in the first field-effect transistor region, the first input/output region, the second field-effect transistor region, and the second input/output region;
forming a high-k dielectric layer over the interfacial layer in the first field-effect transistor region, the first input/output region, the second field-effect transistor region, and the second input/output region;
forming a second capping layer over the interfacial layer in the first field-effect transistor region, the first input/output region, the second field-effect transistor region, and the second input/output region;
forming a work function metal layer over the interfacial layer in the first field-effect transistor region, the first input/output region, the second field-effect transistor region, and the second input/output region;
forming a polysilicon layer over the interfacial layer in the first field-effect transistor region, the first input/output region, the second field-effect transistor region, and the second input/output region;
forming a first field-effect transistor of the first-type of conductivity in the first field-effect transistor region, the first field-effect transistor including the interfacial layer, the first capping layer formed over the interfacial layer, the high-k dielectric layer formed over the interfacial layer, the work function metal layer formed over the high-k dielectric layer, and the polysilicon layer formed over the work function metal layer; and
forming a second field-effect transistor of the second-type of conductivity in the second field-effect transistor region, the second field-effect transistor including the interfacial layer, the high-k dielectric layer formed directly on the interfacial layer such that the high-dielectric layer physically contacts the interfacial layer; the work function metal layer formed over the high-k dielectric layer, and the polysilicon layer formed over the work function metal layer.

9. The method of claim 8, further comprising removing the first capping layer from the second field-effect transistor region and the second input/output region prior to forming the high-k dielectric layer over the interfacial layer in the first field-effect transistor region, the first input/output region, the second field-effect transistor region, and the second input/output region.

10. The method of claim 8, further comprising removing the second capping layer from the first field-effect transistor region and the first input/output region prior to forming the work function metal layer over the interfacial layer in the first field-effect transistor region, the first input/output region, the second field-effect transistor region, and the second input/output region.

11. The method of claim 8, wherein the first capping layer includes a p-type work function metal layer and the second capping layer includes an n-type work function metal layer.

12. The method of claim 8, wherein the first capping layer includes an n-type work function metal layer and the second capping layer includes a p-type work function metal layer.

13. A method comprising:
providing a substrate having a first transistor region of a first-type of conductivity, a first input/output region of the first-type of conductivity, a second transistor region of a second-type of conductivity, and a second input/output region of the second-type of conductivity;
forming a dielectric layer in the first transistor region, the first input/output region, the second transistor region, and the second input/output region;
forming a first capping layer directly on the dielectric layer in the first transistor region, the first input/output region, the second transistor region, and the second input/output region;
forming a high-k dielectric layer over the dielectric layer in the first transistor region, the first input/output region, the second transistor region, and the second input/output region;
forming a second capping layer over the dielectric layer in the first transistor region, the first input/output region, the second transistor region, and the second input/output region;
forming a metal layer over the dielectric layer in the first transistor region, the first input/output region, the second transistor region, and the second input/output region; and
forming a gate electrode layer over the dielectric layer in the first transistor region, the first input/output region, the second transistor region, and the second input/output region.

14. The method of claim 13, further comprising removing the first capping layer from the first transistor region and the first input/output region prior to forming the high-k dielectric layer over the dielectric layer in the first transistor region, the first input/output region, the second transistor region, and the second input/output region, and
wherein forming the high-k dielectric layer over the dielectric layer in the second transistor region and the second input/output region includes forming the high-k dielectric layer directly on the first capping layer in the second transistor region and the second input/output region.

15. The method of claim 14, wherein the first-type of conductivity is p-type and the second-type of conductivity is n-type.

16. The method of claim 13, wherein forming the metal layer over the dielectric layer in the first transistor region, the first input/output region, the second transistor region, and the second input/output region includes forming the metal layer directly on the second capping layer in the first transistor region, the first input/output region, the second transistor region, and the second input/output region.

17. The method of claim 13, wherein the first capping layer includes an n-type work function metal layer and the second capping layer includes a p-type work function metal layer.

18. The method of claim 13, wherein forming the gate electrode layer over the dielectric layer in the first transistor region, the first input/output region, the second transistor region, and the second input/output region includes forming a polysilicon layer directly on the metal layer in the first transistor region, the first input/output region, the second transistor region, and the second input/output region.

19. The method of claim 13, wherein the first-type of conductivity is n-type and the second-type of conductivity is p-type.

20. The method of claim 8, wherein the first capping layer physically contacts the interfacial layer in the first field-effect transistor,
wherein the high-k dielectric physically contacts the first capping layer in the first field-effect transistor, and
wherein the polysilicon layer physically contacts work function metal layer in the first field-effect transistor.

* * * * *